US012787723B2

(12) United States Patent
Chen et al.

(10) Patent No.: US 12,787,723 B2
(45) Date of Patent: Nov. 3, 2026

(54) SYSTEM, APPARATUS, AND METHOD FOR IMPROVING PHOTORESIST COATING OPERATIONS

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Chun-Ming Chen, Hsinchu (TW); Chien-Liang Lin, Hsinchu (TW); Chun-Hsiang Wang, Hsinchu (TW); Jen-Yu Tsai, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 66 days.

(21) Appl. No.: 18/789,582

(22) Filed: Jul. 30, 2024

(65) Prior Publication Data

US 2024/0387172 A1 Nov. 21, 2024

Related U.S. Application Data

(62) Division of application No. 17/174,898, filed on Feb. 12, 2021.

(30) Foreign Application Priority Data

Feb. 2, 2021 (CN) ........................ 202110142399.7

(51) Int. Cl.
*H10P 76/20* (2026.01)
*B05B 12/08* (2006.01)
(Continued)

(52) U.S. Cl.
CPC .......... *H10P 76/204* (2026.01); *B05B 12/081* (2013.01); *B05C 11/101* (2013.01); (Continued)

(58) Field of Classification Search
CPC ............. H10P 72/0604; H10P 72/0602; B05B 12/081; B05C 11/1047
See application file for complete search history.

(56) References Cited

U.S. PATENT DOCUMENTS 3,213,913 A 10/1965 Petriello
3,229,014 A 1/1966 Petriello
(Continued)

OTHER PUBLICATIONS

"Composition" Merriam-Webester, Inc., www.merriam-webster.com, p. 1. (Year: 2025).

*Primary Examiner* — Nathan T Leong
(74) *Attorney, Agent, or Firm* — Hauptman Ham, LLP

(57) ABSTRACT

A coating system and a method for using such a system comprising a vessel, a flexible container within the vessel, and a coating apparatus. The flexible container includes an outlet port, wherein the flexible container is configured to contract in response to an increase in pressure within the vessel. The flexible container is configured to output a coating composition through the outlet port in response to contraction. The coating apparatus is configured to receive the coating composition from the outlet port and in some embodiments, deliver the coating composition to a wafer surface.

20 Claims, 7 Drawing Sheets

(51) Int. Cl.
*B05C 11/10* (2006.01)
*G03F 7/16* (2006.01)
*H10P 72/00* (2026.01)

(52) U.S. Cl.
CPC ...... *B05C 11/1042* (2013.01); *B05C 11/1047* (2013.01); *G03F 7/16* (2013.01); *H10P 72/0402* (2026.01); *H10P 72/0448* (2026.01); *H10P 72/0602* (2026.01); *H10P 72/0604* (2026.01)

(56) References Cited

U.S. PATENT DOCUMENTS

| | | | | |
|---|---|---|---|---|
| 3,339,803 | A | 9/1967 | Wayne | |
| 3,450,254 | A | 6/1969 | Miles | |
| 3,592,360 | A | 7/1971 | Aleck | |
| 4,098,434 | A | 7/1978 | Uhlig | |
| 4,641,765 | A | 2/1987 | Diamond | |
| 5,343,908 | A | 9/1994 | Furstenberg | |
| 5,522,523 | A | 6/1996 | Nogles | |
| 5,597,085 | A | 1/1997 | Rauworth | |
| 6,015,066 | A | 1/2000 | Kimura | |
| 6,616,760 | B2 | 9/2003 | Kitano | |
| 7,685,963 | B2 | 3/2010 | Lee | |
| 2004/0144736 | A1 | 7/2004 | Yajima | |
| 2005/0238504 | A1 | 10/2005 | Yajima | |
| 2007/0272327 | A1 | 11/2007 | Lin | |
| 2008/0230492 | A1 | 9/2008 | Kao | |
| 2012/0240958 | A1 | 9/2012 | Higuchi | |
| 2013/0193164 | A1 * | 8/2013 | Tom | B65D 25/16 222/105 |
| 2014/0131380 | A1 | 5/2014 | Pethe | |
| 2015/0048035 | A1 | 2/2015 | Liao | |
| 2015/0092167 | A1 | 4/2015 | Terashita | |
| 2015/0261089 | A1 | 9/2015 | Zhou et al. | |
| 2015/0262817 | A1 | 9/2015 | Okuno | |
| 2015/0328649 | A1 | 11/2015 | Carcasi | |
| 2018/0067395 | A1 * | 3/2018 | Zhou | G03F 7/16 |
| 2018/0074407 | A1 | 3/2018 | Yoshihara | |
| 2018/0174826 | A1 | 6/2018 | Raaijmakers | |

* cited by examiner

SYSTEM, APPARATUS, AND METHOD FOR IMPROVING PHOTORESIST COATING OPERATIONS

PRIORITY STATEMENT

This application is a divisional of U.S. patent application Ser. No. 17/174,898, filed Feb. 12, 2021, which claims priority to China Application No. 202110142399.7, filed Feb. 2, 2021, the contents of which are hereby incorporated by reference in their entireties.

BACKGROUND

Uniformity and quality of photoresist layers used in the manufacture of semiconductor devices is a factor in determining overall yield of the manufacturing process. Some methods and systems for dispensing photoresist have relied on pressurizing the headspace above a quantity of photoresist within a sealed container, typically by introducing compressed nitrogen from a line or tank, to force the photoresist out of the container and into a lower pressure outlet line. One or more filters, vibrators, traps and/or other treatment elements are utilized downstream of the photoresist container for removing or reducing the particulate and/or bubble content of the photoresist composition stream before the photoresist composition is dispensed onto a semiconductor substrate surface.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
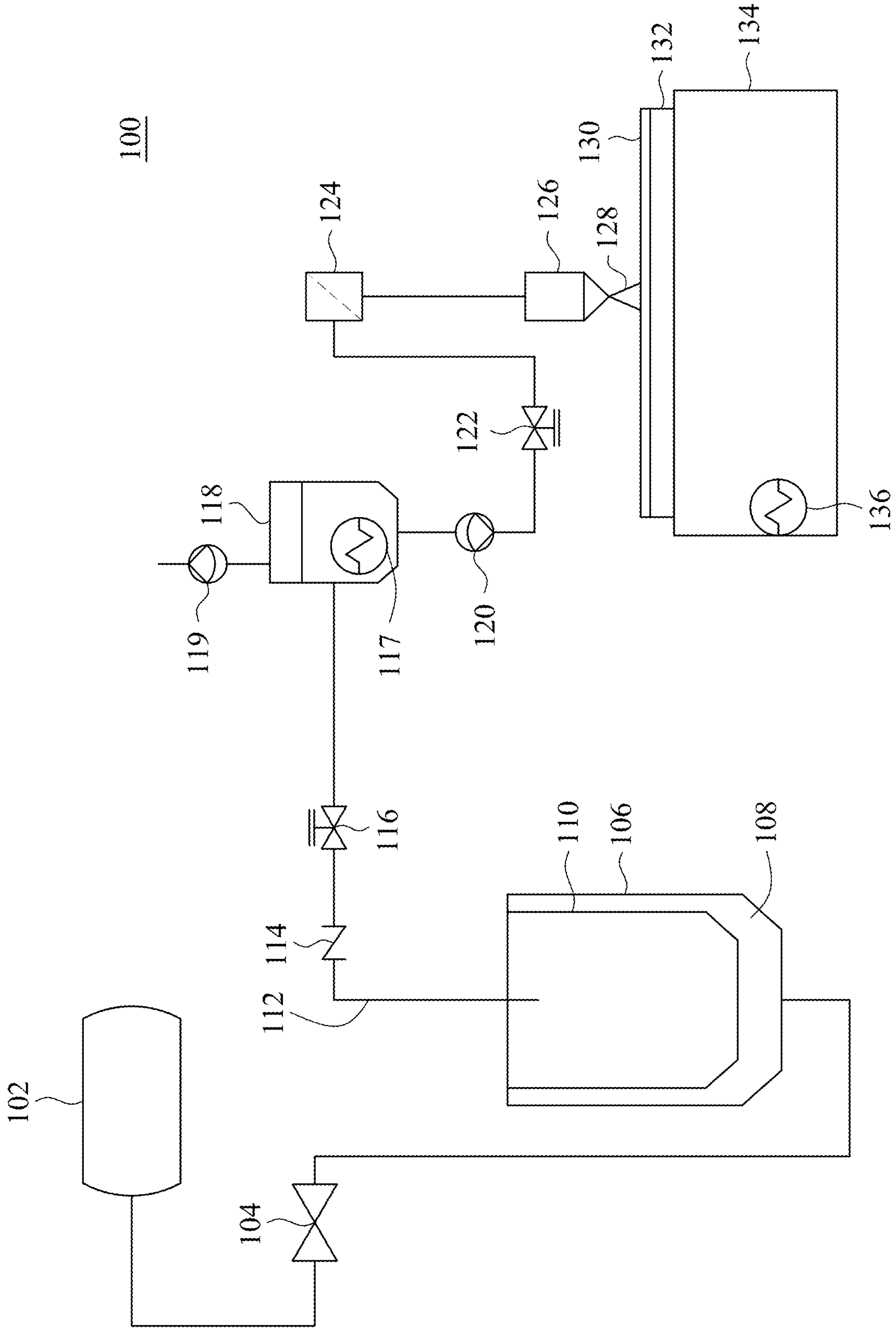
FIG. 1 is a schematic view of a photoresist dispensing system in accordance with some embodiments.

This description of the exemplary embodiments is intended to be read in connection with the accompanying drawings, which are to be considered part of the entire written description. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For example, a description of the placement of a first element before or after a second element along a coating composition flow path within a coating apparatus should be understood to include embodiments in which the placement of the first and second elements are reversed and/or interspersed with other functional elements as long as the effect(s) and/or function(s) associated with the first and second elements are substantially retained in the alternative configurations.

Holding volumes of the photoresist compositions in a container under pressurized gas, however, tends to increase the gas content of the pressurized photoresist. As a result, when the pressurized photoresist is dispensed onto the substrate and exposed to atmospheric pressure, the reduced pressure reduces the solubility of the gases dissolved in the photoresist composition. If the solubility of the gases was reduced below the actual dissolved gas content within the photoresist composition, the excess gas tends to form bubbles in the photoresist at the point of application. Further, because the residence time of the photoresist composition under the pressurized gas and the relative quantities of pressurized gas and the photoresist composition could vary widely, the amount of dissolved gas(es) also varies widely.

Figure 4B:
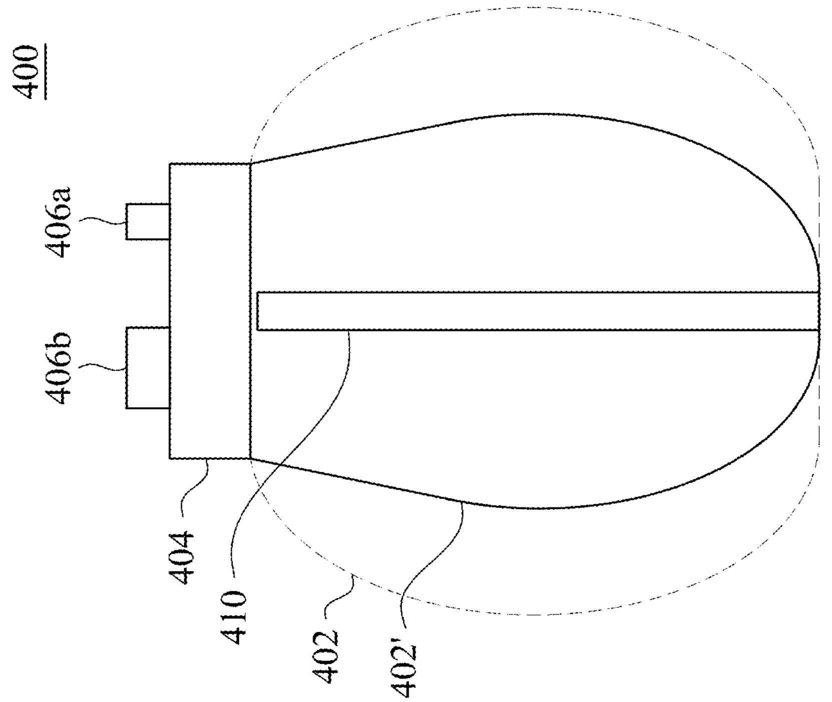
FIGS. 4A and 4B are schematic views of a photoresist container according to some embodiments.
Figure 4A:
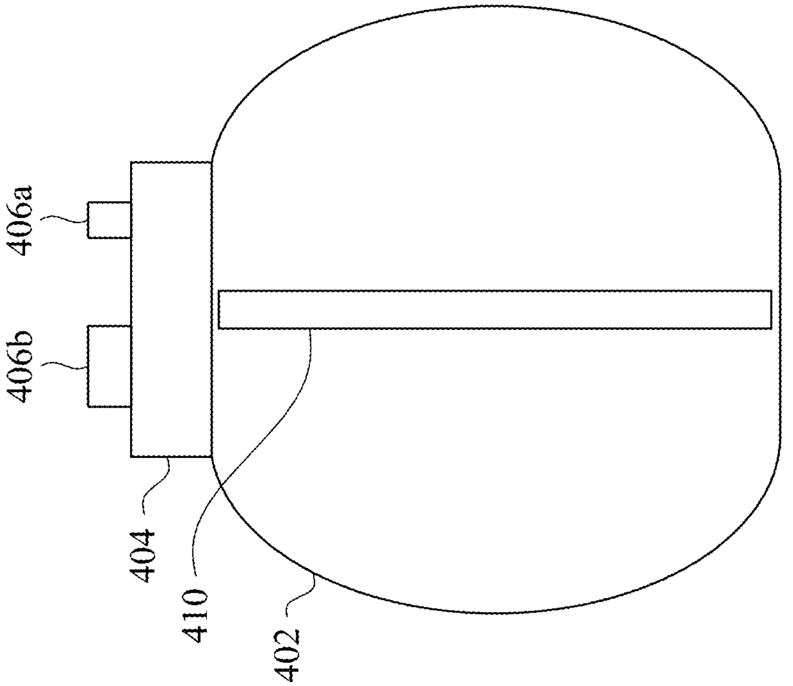

In addition to the increase in the volume of dissolved gas(es) resulting from holding the photoresist under pressure, the gas(es) used to establish and maintain the pressure in the photoresist container potentially introduce other contaminants in the form of particles and/or moisture. Further, a loss of positive pressure within the photoresist container potentially allows the ambient gases present in the clean room to be pulled into the photoresist container and any photoresist residing therein. FIG. 1 is a schematic diagram of a photoresist dispensing system 100 in accordance with some embodiments. The photoresist dispensing system 100 includes a pressurized gas source 102, that is connected through a control valve 104 to a pressure vessel 106 for providing pressurized gas (such as air, O2, N2, other gas or gas mixture) to an internal volume 108 defined by the pressure vessel 106. A flexible photoresist container 110, a non-limiting embodiment of which is described below with reference to FIGS. 4A-B is arranged within the pressure vessel whereby the pressurized gas within the pressure vessel will compress the flexible photoresist container 110 to force a quantity of photoresist into outlet line 112. In some embodiments, the outlet line will include one or more check valves 114 for maintaining a single flow direction for the photoresist, one or more filters (not shown), trap or mini-trap (not shown) and/or a control valve 116.

In FIG. 1, in some embodiments, the photoresist flowing through the outlet line 112 is used to fill, at least partially, an intermediate photoresist reservoir 118 with a first volume of photoresist for coating a plurality of semiconductor substrates. In some embodiments, the intermediate photoresist reservoir 118 is provided with a heat exchanger 117 and/or a pump 119 for use in controlling the temperature of the photoresist and/or the pressure applied to the photoresist within intermediate photoresist reservoir 118. From the intermediate reservoir, the photoresist will pass through a metered pump 120, one or more control valves 122, and/or one or more filters 124 to reach the dispensing nozzle 126. In some embodiments, one or more of the metered pump 120, the one or more control valves 122, and/or the one or more filters 124 are omitted.

A second volume of the photoresist is then dispensed through the dispensing nozzle 126 as a stream or spray 128 onto the surface of a semiconductor substrate 132 to form, in combination with lateral and/or arcuate movement of the dispensing nozzle and/or lateral and/or rotational movement of the chuck 134, a photoresist film 130. In some embodiments, a ratio between the first volume of photoresist and the second volume of photoresist will be at least 5:1 so that the intermediate photoresist reservoir 118 contains enough photoresist to coat several semiconductor substrates 132 without needing to be replenished from the volume of photoresist maintained within the flexible photoresist container 110. In some embodiments, the chuck 134 includes a heat exchanger 136, the heat exchanger 136 being arranged and configured for controlling a chuck temperature. As will be appreciated, in some embodiments the dispensing operation also includes the application of one or more solvents and/or solutions to the bare substrate surface and/or to a quantity of previously dispensed photoresist in order to obtain a photoresist film having the desired qualities.

Figure 2:
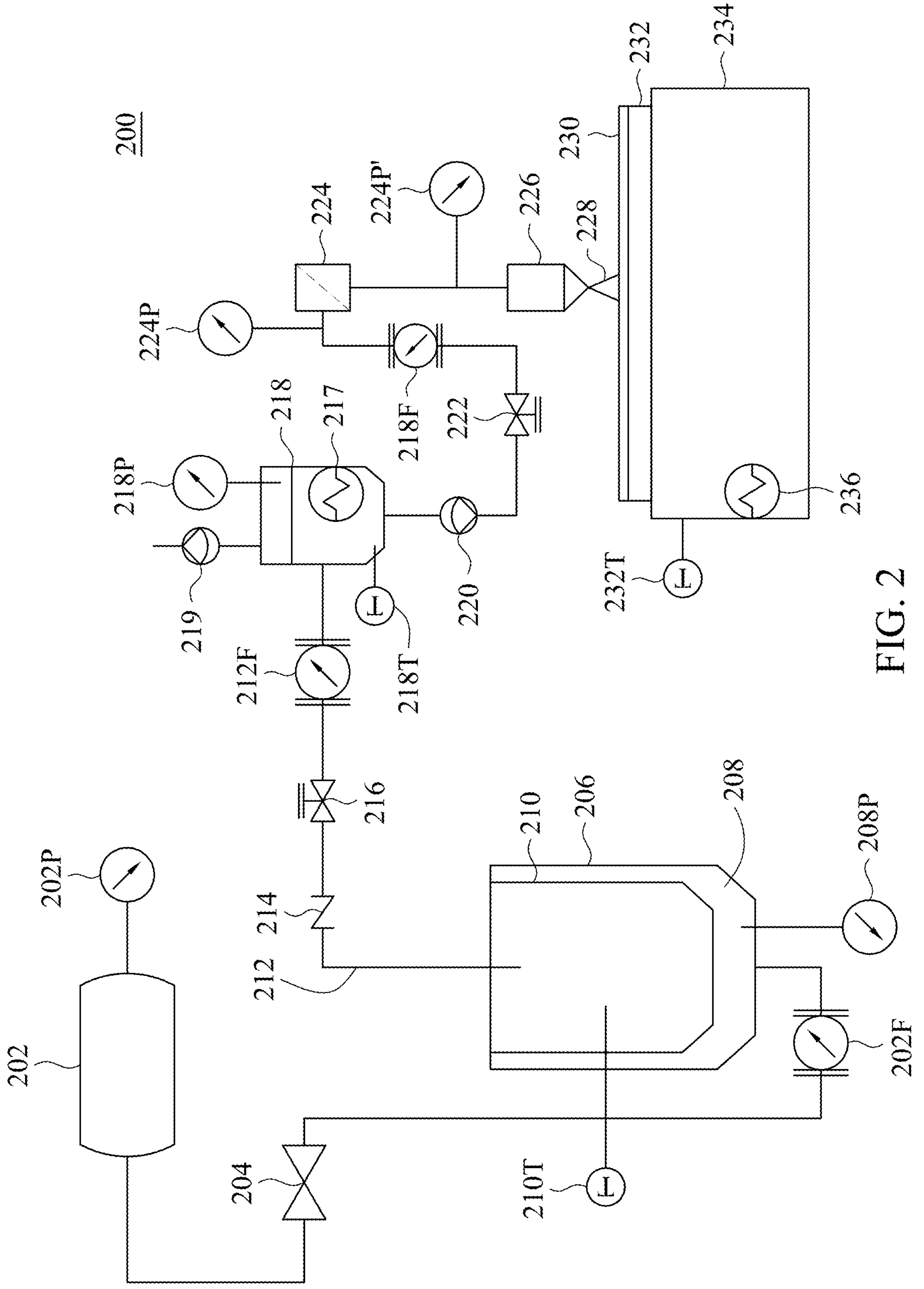
FIG. 2 is a schematic view of a photoresist dispensing system in accordance with some embodiments.

Accordingly, embodiments of photoresist dispensing system 100 according to FIG. 1 allow for the pressurization of the photoresist without allowing direct contact between the photoresist and the pressurized gas. By avoiding direct contact between the photoresist and the pressurized gas, the quantity of gas dissolved in the photoresist, if any, does not increase over time; and variations in the dissolved gas content within the photoresist are reduced or avoided. By avoiding the introduction of additional dissolved gas into the photoresist, the formation of bubbles resulting from outgassing when the pressure applied to the photoresist is released during the application process is reduced or eliminated. By reducing or eliminating bubble formation within the photoresist layer, the photoresist dispensing systems according to FIG. 1 provide improved uniformity of the resulting photoresist layer. Further, by isolating the photoresist from the interior of the pressure vessel, the photoresist dispensing system according to FIG. 1 reduces the likelihood of contamination being introduced into the photoresist if the pressure vessel were to lose positive pressure relative to the fabrication area in which the photoresist dispensing system is housed. FIG. 2 is a schematic diagram of a photoresist dispensing system 200 in accordance with some embodiments. The photoresist dispensing system 200 includes a pressurized gas source 202 that is monitored by a pressure sensor 202P and that is connected through a control valve 204 and a flowmeter 202F to a pressure vessel 206 for providing pressurized gas (such as N2 or other gas) to an internal volume 208 defined by the pressure vessel and monitored by a pressure sensor 208P.

A flexible photoresist container 210 is arranged within the pressure vessel 206 whereby the pressurized gas within the pressure vessel will tend to compress the sides of the flexible photoresist container 210 to force a quantity of photoresist into outlet line 212. The condition of the photoresist maintained within the flexible photoresist container 210 is monitored by a temperature sensor 210T and/or a pressure sensor (not shown). The outlet line 212 includes one or more check valves 214 for maintaining a single flow direction for the photoresist, one or more filters (not shown), trap or mini-trap (not shown), a flowmeter 212F, and/or a control valve 216. In one or more embodiments, the outlet line 212 omits one or more of the one or more check valves 214, the one or more filters, trap, or mini-trap and/or the control valve 216.

In FIG. 2, in some embodiments the photoresist flowing through the outlet line 212 is used to fill, at least partially, an intermediate photoresist reservoir 218 with a first volume of photoresist that is sized for coating one or more semiconductor substrates 232 with a second volume of photoresist. In some embodiments, a ratio between the first volume and the second volume will be at least 5:1 so that the intermediate photoresist reservoir 218 contains enough photoresist for coating several wafers 232 without needing to be replenished. The intermediate photoresist reservoir 218 is provided with a heat exchanger 217 and/or a pump 219 for use in controlling the temperature of the photoresist and/or the pressure applied to the photoresist within intermediate photoresist reservoir 218. In some embodiments, heat exchanger 217 and/or pump 219 are omitted from intermediate photoresist reservoir 218. In some embodiments, the condition of the photoresist held within the intermediate photoresist reservoir 218 is monitored by a pressure sensor 218P and or a temperature sensor 218T. In some embodiments, the photoresist within the intermediate photoresist reservoir 218 will be subjected to additional processing to further reduce the quantity of gas(es) within the photoresist composition and/or adjust the viscosity of the photoresist composition.

In some embodiments, the photoresist composition maintained within the intermediate photoresist reservoir 218 will be subjected to reduced pressure for a treatment period sufficient to remove a portion of dissolved gas(es) from the photoresist composition in those instances in which the photoresist was not degassed before being loaded into the flexible photoresist container 210. While the flexible photoresist container 210 isolates the photoresist from the pressurized gas maintained in internal volume 208 to avoid increasing the volume of dissolved gas within the photoresist, unless degassed before loading, the photoresist within the flexible photoresist container 210 includes a base level of dissolved gas. In some embodiments, pump 219 will be used to produce the reduced pressure in the intermediate photoresist reservoir 218.

In addition to the reduced pressure, in some embodiments, the photoresist maintained within the intermediate photoresist reservoir will be subjected to increased temperature in order to reduce the solubility of dissolved gas(es) within the photoresist and/or reduce the viscosity of the photoresist composition. In some embodiments, after leaving the intermediate reservoir, the photoresist will pass through a metered pump 220, one or more control valves 222, and/or one or more filters 224 to reach the dispensing nozzle 226 where the photoresist 228 is be applied to the surface of a semiconductor substrate.

In some embodiments, the output of the metered pump 220 is monitored by a flow sensor 218F and/or a pressure sensor 224P. In some embodiments, in addition to the pressure sensor 224P, another pressure sensor 224P' will be provided downstream of filter 224 in order to evaluate the pressure drop across the filter as a measure of the condition of the filter. In some embodiments, the pressure sensor 224P' will be used to monitor the pressure of the photoresist entering the dispensing nozzle 226.

The photoresist 228 is then dispensed through the dispensing nozzle 226 onto the surface of a semiconductor substrate 232 to form, in combination with lateral and/or arcuate movement of the dispensing nozzle 226 and/or lateral and/or rotational movement of the chuck 234, a photoresist film 230 on the surface of the semiconductor substrate 232. In addition to controlling the movement of the chuck 234, in some embodiments a temperature sensor 232T monitors the temperature of the chuck and, in conjunction with a heat exchanger 236, is used for adjusting and/or maintaining the temperature of the chuck within a target temperature range for improving the uniformity of the photoresist film 230 formed on successive semiconductor substrates 232. As will be appreciated, in some embodiments the dispensing operation also includes the application of one or more solvents and/or conditioning solutions to the bare semiconductor substrate surface and/or to a quantity of previously dispensed photoresist in order to obtain a photoresist film having the desired parameters, e.g., thickness, uniformity, and adhesion.

Accordingly, embodiments of photoresist dispensing system 200 according to FIG. 2 allow for the pressurization of the photoresist without any direct contact between the photoresist and the pressurized gas. Because there is no direct contact between the photoresist and the pressurized gas, the quantity of gas dissolved in the photoresist, if any, does not increase over the variable time the photoresist is maintained within the system and variations in the dissolved gas content within the photoresist are reduced or avoided. By avoiding the introduction of additional dissolved gas into the photoresist, the formation of bubbles resulting from outgassing when the pressure applied to the photoresist is released during the application process are reduced or eliminated. By reducing or eliminating bubble formation within the photoresist layer, the photoresist dispensing system according to FIG. 2 provides improved uniformity of the resulting photoresist layer. Further, by isolating the photoresist from the interior of the pressure vessel, the photoresist dispensing system according to FIG. 2 reduces the likelihood of contamination being introduced into the photoresist if the pressure vessel were to lose positive pressure relative to the fabrication area in which the photoresist dispensing system is housed.

Figure 3:
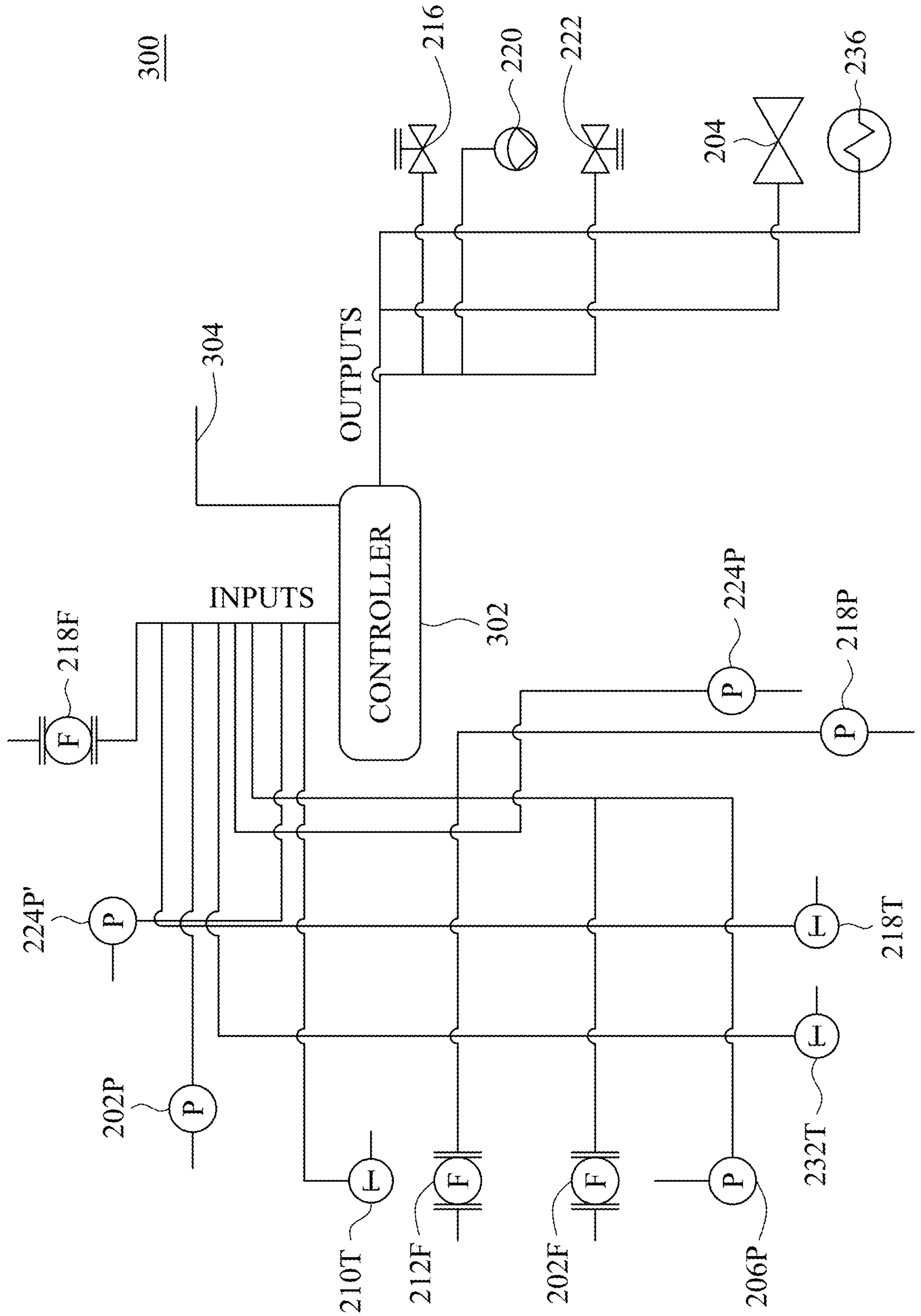
FIG. 3 is a schematic view of a process control system useful in the operation of photoresist dispensing systems in accordance with some embodiments.

FIG. 3 is a schematic diagram of a control system 300 useful in operating a photoresist dispensing system in accordance with some embodiments. The description of control system 300 is based on elements from photoresist dispensing system 200. In some embodiments, control system 300 is applicable to other photoresist dispensing systems. In some embodiments, the control system 300 for the photoresist dispensing system includes a controller 302 configured to receive input signals from one or more of the pressure sensor, temperature sensor, flow sensor, and other sensors provided throughout the photoresist dispensing system 200. In some embodiments, the controller 302 is configured to communicate over a bus 304 as part of an electronic process control (EPC) system.

In some embodiments, the controller is configured to access one or more memory modules which maintain control instructions and target parameter ranges for the operation of the photoresist dispensing system. In some embodiments, the controller 302 is a component in an electronic process control (EPC) system. In some embodiments, the EPC system is configured in accord with the EPC system of FIG. 7. In some embodiments the controller is configured to output operational information to one or more displays for operator reference, confirmation, and/or adjustment. In some embodiments, the controller is configured to receive inputs from an operator and/or other devices through one or more input/output modules that will be used for adjusting one or more parameters in the operation of the photoresist dispensing system. In some embodiments, the controller is configured to output predetermined information and/or alarms to other devices and/or an operator in order to coordinate the operation of the photoresist dispensing system with other equipment and/or prevent out of range operation.

In some embodiments, the controller 302 uses the inputs from the various sensors, valves, pumps, heat exchangers, memory modules, and/or the input/output modules to determine whether to adjust pressure, temperature, and/or photoresist flow within the photoresist dispensing system in order to maintain the desired operating conditions of the photoresist dispensing system 200. In those instances, in which the controller makes one or more adjustments, the controller is configured to output control signals to modify the operation of one or more of the valves, pumps, heaters, chillers, heat exchangers, and/or other active elements within the photoresist dispensing system in order to maintain satisfactory operation.

In some embodiments, the electronic process control (EPC) system 700 is used for monitoring a pressure (Pv) within the pressurized internal volume 208 defined between the pressure vessel 206 and the flexible photoresist container 210 by controlling a flowrate at which additional pressurized gas is introduced into the monitored pressurized internal volume 208 to maintain an operational pressure between a Target Pressure Low (TPL) and a Target Pressure High (TPH). In some embodiments, the electronic process control (EPC) system 700 is used for monitoring a flowrate FR of photoresist into an intermediate reservoir and controlling a flowrate at which the pressurized gas is introduced into the pressurized internal volume 108, 208 to maintain the monitored flowrate between a lower Target Flowrate Low (TFL) and a higher Target Flowrate High (TFH).

In some embodiments, the quantity of gases dissolved in the photoresist is further reduced by isolating a volume of the coating composition within the intermediate photoresist reservoir 118, 218 while engaging a pump 119, 219 to reduce the pressure applied to the volume of the coating composition to below 1 atm for a fixed or variable treatment period to obtain a degassed photoresist composition. In some embodiments, in addition to or in place of the low pressure treatment, a heat exchanger 117, 217 is utilized for increasing the temperature of the photoresist, thereby reducing the solubility of gas(es) within the photoresist. The gas(es) released from the photoresist are then released or evacuated using pump 119, 219 to obtain a degassed photoresist composition. The degassed photoresist composition is then released from the intermediate photoresist reservoir 118, 218 for application to the semiconductor substrate 132, 232.

In some embodiments, the coating composition is degassed before being introduced into the flexible photoresist container 110 by preparing or obtaining a coating composition and then maintaining the coating composition under a vacuum for a treatment period that reduces by at least 20% a volume of gas dissolved in the coating composition to obtain a treated coating composition. In some embodiments, the treated coating composition is then introduced into the flexible container, a first volume of the treated composition corresponding to a fill volume of the flexible container, the filled volume defined by an interior surface of the flexible container, wherein the filled volume is greater than the initial volume.

In some embodiments, the coating composition is degassed before being introduced into the flexible container by preparing or obtaining a coating composition and then maintaining the coating composition under an elevated temperature for a treatment period that reduces by at least 20% a volume of $N_2$, $O_2$, $CO_2$, and mixtures thereof dissolved in the coating composition to obtain a treated coating composition. In some embodiments, the treated coating composition is then introduced into the flexible container, a first volume of the treated composition corresponding to a fill volume of the flexible container, the filled volume defined by an interior surface of the flexible container, wherein the filled volume is greater than the initial volume.

In some embodiments, a portion of residual gas is removed from the flexible container before filling the flexible container with photoresist. In some embodiments, a volume of photoresist in excess of the fill volume of the flexible container is utilized to generate a purge stream of excess photoresist for removing residual gas, if any, from within the flexible container.

FIG. 4A is a diagram of a flexible photoresist container 400 in accordance with some embodiments. The flexible photoresist container 400 includes a main storage reservoir 402 that is attached to and forms enclosed storage volume with an attachment assembly 404. The main storage reservoir may be manufactured from any material that has a combination of strength sufficient to maintain structural integrity when pressurized while still being sufficiently flexible to collapse as the photoresist is withdrawn from the container. Embodiments may be manufactured from a range of polymer types, e.g., polyamides (PA), polyethylenes (PE), polyethylene terephthalate (PET), polypropylenes (PP), polyvinyl chlorides (PVC), polyvinylidene chlorides (PVDC), acrylonitrile butadiene styrene (ABS), and may include more than one molecular configuration of a single polymer and/or two or more types of polymer in combination. The flexible photoresist container 400 is fillable through a port 406*a*, 406*b*. In some embodiments, one or more of the ports 406*a*, 406*b* is configured for establishing a removable connection to both a fill line (through which photoresist will be injected into the flexible photoresist container 400 during a filling operation) and the output line (during operation) of the photoresist dispensing system.

Depending on the placement of any check valves or other hardware, establishing the proper connections to the ports 406*a*, 406*b* provided on the flexible photoresist container allows for proper operation of the coating system. Further, because the use of the inlet and/or outlet ports provides a sealed flexible photoresist container, the orientation of the container is less important in some embodiments. Indeed, in some embodiments orienting or manufacturing the flexible photoresist container whereby the outlet port is provided adjacent the lowest portion of the container will assist in removing the contents with one or more pumps rather than an externally applied pressure.

In some embodiments, the walls of the main storage reservoir 402 include at least one region of a reinforcing material 410 that increases the strength and/or dimensional stability of the main storage reservoir 402.

In some embodiments, the flexible photoresist container 400 will include a single port 406*a* with both the fill line and output line being configured with complementary attachment assemblies to ensure that the connection is maintained for the duration of the relevant operations. In some embodiments, a plurality of ports 406*a*, 406*b* are utilized and will include dedicated input and output ports that are configured differently to ensure proper connections are established and maintained for the duration of the relevant operations.

FIG. 4B is a diagram of a flexible photoresist container 400 in accordance with some embodiments. In comparison to the flexible photoresist container 400 in FIG. 4A, a portion of the initial photoresist volume has been removed from the main storage reservoir 402' through one or more of the ports 406*a*, 406*b* and the walls of the flexible photoresist container 400 have contracted accordingly. In some embodiments, the walls of the main storage reservoir 402 are manufactured from a flexible and durable material that is generally impervious to the photoresist and anticipated environmental conditions and contaminants that will be found (or are likely to be found) in the manufacturing, packaging, transport, and semiconductor device fabrication environments. The walls of the main storage reservoir 402 are manufactured from a range of polymeric materials including, without limitation, polyvinyl chloride (PVC), polyethylene (PE), and polypropylene (PP).

As the photoresist is removed from the main storage reservoir 402, the walls of the main storage reservoir 402 contract to conform to the enclosed storage volume of the remaining volume of photoresist. By ensuring that the flexible photoresist container 400 remains completely filled with photoresist over a wide volume range, the contracting walls of the flexible photoresist container help prevent external gases and/or contaminants from entering the flexible photoresist container. In some embodiments, the walls of the main storage reservoir 402 will include reinforcing material 410 and/or additional structure, e.g., pleats, folds, and/or biasing means, which help to control the manner in which the walls contract or expand in response to changes in pressure within the pressure vessel and/or the volume of photoresist within the main storage reservoir 402.

For example, in some embodiments, the walls of the main storage reservoir 402 will include a band of peripheral reinforcing material 410, e.g., an arrangement of fibers, strips and/or other regions of a stronger (higher density), thicker, and/or less flexible type of material, polymer, and combinations thereof, for increasing the structural integrity of the main storage reservoir, to which one or more sheets or regions of more flexible material are used in combination to form the wall(s) of the main storage reservoir. In some embodiments, the walls of the main storage reservoir may comprise two flexible sheets that are bonded or otherwise joined along a periphery to form a thicker band of reinforcing material 410. With such an arrangement, the reinforcing material 410 assists in maintaining dimensional stability in one or more dimensions even as the volume of the main storage reservoir decreases as the photoresist is consumed. Similarly, in some embodiments vertical or horizontal pleats will be used to control the "collapse" of the flexible photoresist container to avoid sagging and/or increase the volume of photoresist or other coating composition removed from the flexible photoresist container 400 as the main storage reservoir 402 is compressed by the external pressure.

Although the volume of the main storage reservoir 402 decreases as the photoresist is consumed, the attachment assembly 404 is configured and constructed to provide a more dimensionally stable attachment structure by which a flexible photoresist container is attached to the photoresist filling assembly of a photoresist dispensing system (not shown), directly to photoresist coating equipment which does not include a separate pressure vessel and extracts the photoresist from the flexible photoresist container using a pump rather than a pressure vessel, and/or to the pressure vessel used to apply external pressure to the flexible photoresist container. The use of a flexible photoresist container 400 configured for attachment to a pressure vessel that remains fixed within the photoresist coating equipment reduces manufacturing costs and required storage volume by eliminating the need for a separate pressure vessel for each flexible photoresist container while still suppressing or eliminating bubble formation as the photoresist is dispensed onto a substrate.

Figure 5B:
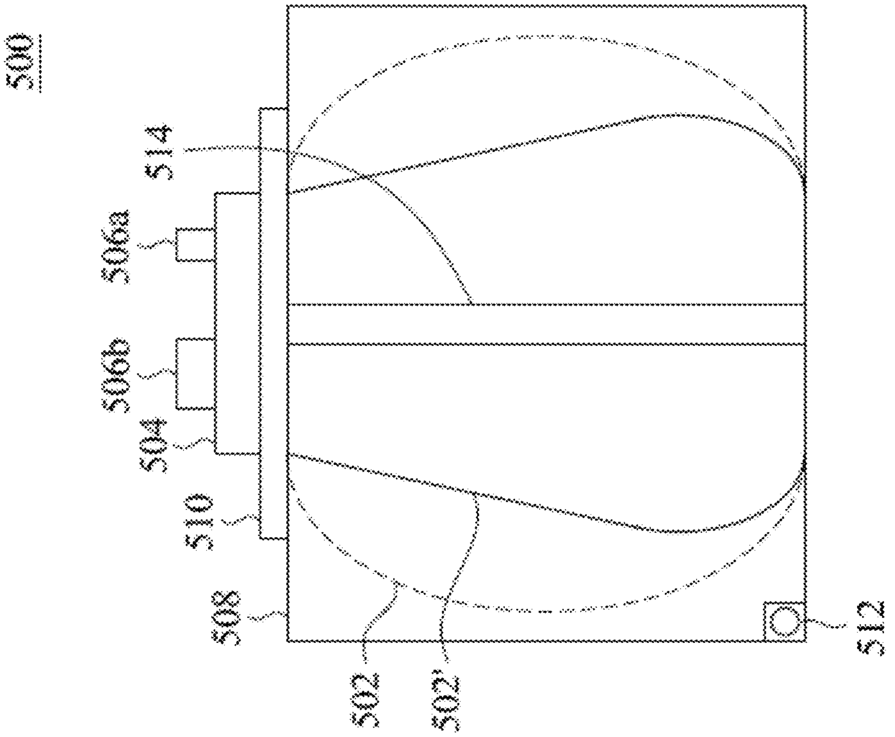
FIGS. 5A and 5B are schematic views of a photoresist container according to some embodiments.
Figure 5A:
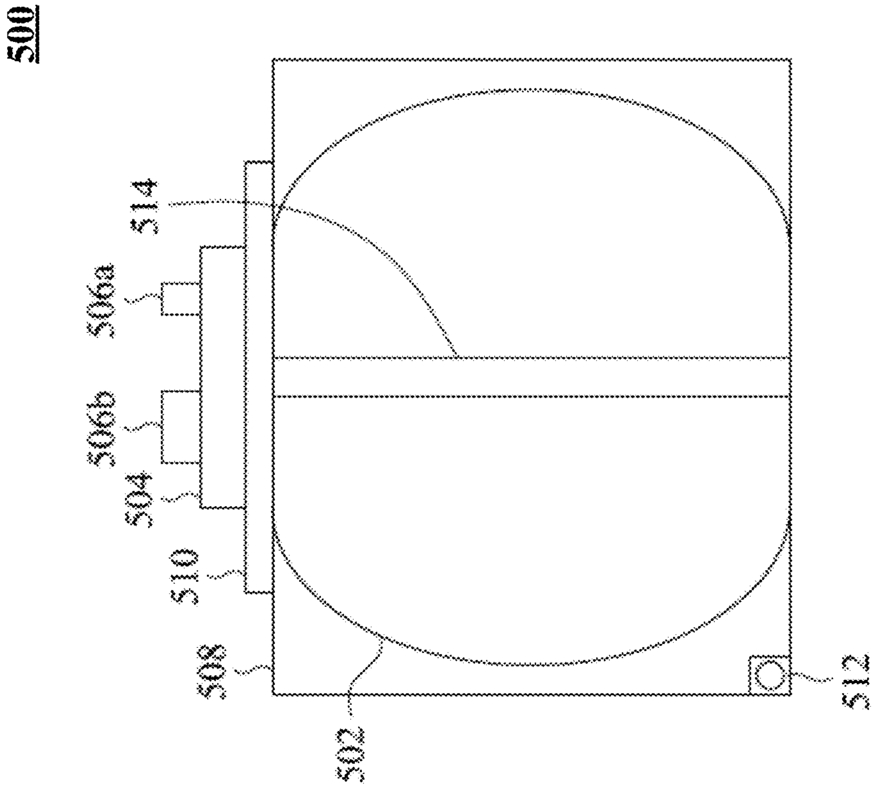

FIG. 5A illustrates an embodiment of a photoresist container 500 useful in practicing the disclosed methods in which a flexible photoresist container comprising a main storage reservoir 502 is incorporated within a pressure vessel 508 to form a more integrated or unitary assembly than that shown in FIG. 4A. In some embodiments, the enclosed storage volume is defined between the main storage reservoir 502 and an attachment assembly 504. The photoresist container 500 will be provided with port 506*a*, 506*b* through which the main storage reservoir 502 will be filled and/or emptied. In some embodiments, one or more ports 506*a*, 506*b* will be configured for establishing a removable connection to both a fill line (for introducing photoresist into the main storage reservoir 502) and an output line (during operation) of the photoresist dispensing system. In some embodiments, one port 506*a* will be configured for establishing a first removable connection to a fill line (for introducing photoresist into the main storage reservoir 502) and with another port 506*b* being configured for establishing a second removable connection the output line (during operation) of the photoresist dispensing system to avoid cross connections between the fill line, the output line, and the ports 506*a*, 506*b*.

In some embodiments, the pressure vessel 508 will be provided with a complementary second attachment assembly 510 which will cooperate with the first attachment assembly 504 to position the flexible photoresist container within the pressure vessel and define the pressurized space between the inner surface of the pressure vessel and the outer surface of the flexible photoresist container. In some embodiments, the first attachment assembly 504 on the main storage reservoir 502 engages the second attachment assembly 510 on the pressure vessel 508 to form a temporary attachment between the flexible container, the temporary attachment sealing and defining an initial pressurized volume. In some embodiments, compressed gas will be introduced into this pressurized space through port 512 in order to maintain a target or operating pressure range within the pressurized space that tends to force the photoresist composition out of the flexible photoresist container and through a port 506*a*, 506*b*.

In some embodiments, the flexible photoresist container will include only a single port with both the fill line and output line being configured with complementary attachment assemblies to ensure that the connection is maintained for the duration of the relevant operations. In some embodiments, a plurality of ports (not shown) will be utilized and will include dedicated input and output ports that are configured differently (not shown) to ensure proper connections are established and maintained for the duration of the relevant operations.

FIG. 5B illustrates an embodiment of a photoresist container 500 according to FIG. 5A in which a portion of the initial photoresist volume has been removed from the main storage reservoir 502' and the walls of the flexible photoresist container have contracted accordingly with additional compressed gas being introduced into the pressure vessel 508 through port 512 in order to maintain the target or operating pressure within the pressure vessel. The pressure maintained within the pressure vessel will continue compressing the flexible photoresist container and continue urging the photoresist composition through the port 506 and into the coating apparatus where it will undergo some additional processing. In some embodiments, the walls of the main storage reservoir are manufactured from a flexible and durable material that is generally impervious to the photoresist and anticipated environmental fluids and contaminants that will be found in the manufacturing, packaging, transport, and manufacturing environments.

As the photoresist is removed from the main storage reservoir, the walls of the main storage reservoir will contract to match the enclosed storage volume with the remaining volume of photoresist. By ensuring that the flexible photoresist container remains "full" over a wide volume range, the walls of the flexible photoresist container prevent any external gases and/or contaminants from entering the flexible photoresist container. In some embodiments, the walls of the main storage reservoir will include reinforcement and/or additional structure, e.g., pleats, folds, and/or biasing means, which will control the manner in which the walls contract under pressure.

For example, the walls of the main storage reservoir will include a band of peripheral reinforcing material 514 or other internal structure (not shown) to which one or more sheets of a more flexible material are attached to form the main storage reservoir. With such an embodiment, the reinforcing material assists in maintaining dimensional stability in one or more planes even as the volume of the main storage reservoir decreases as the photoresist is consumed and the more flexible material contracts. Similarly, in some embodiments vertical pleats will be used to control the "collapse" or "contraction" of the flexible photoresist container to avoid sagging film and/or increase the volume of photoresist or other coating composition removed from the container as it is compressed by the external pressure established and/or maintained within the pressure vessel.

Although the volume of the main storage reservoir 502 decreases as the photoresist is consumed, the attachment assembly 504 is configured and constructed to provide a more dimensionally stable attachment structure by which the flexible photoresist container will be attached to the photoresist filling assembly (not shown), directly to the photoresist coating equipment (not shown), and/or to the pressure vessel 508 that will be used to apply external pressure to the flexible photoresist container. The use of a unitary flexible photoresist container/pressure vessel photoresist container 500 for mounting within the photoresist dispensing system 100 reduces manufacturing costs, leaks, and/or maintenance time by eliminating the need for operators or technicians to remove a spent flexible photoresist container and attach a new flexible photoresist container to a separate pressure vessel while still suppressing or eliminating bubble formation as the photoresist is dispensed onto a substrate.

Although embodiments of the apparatus, system, and method are not limited to any particular type or viscosity of photoresist compositions, microbubble formation and retention is typically associated with higher viscosity photoresist compositions. A variety of photoresists is available to process engineers in a range of chemistries and viscosities. Polyimide photoresists are generally among the more viscous photoresist compositions, typically having viscosities of a least 50 centipoise. In order to improve the application of high viscosity photoresist compositions, methods have been developed that include the sequential application of a lower viscosity coating composition such as a reducing resist consumption (RRC) material from a source separate from a primary photoresist composition source.

In some embodiments, the primary photoresist composition source and RRC material source both include separate pumps and/or nozzles for sequentially dispensing the photoresist coating and RRC coating(s), respectively. In other embodiments, the photoresist composition and the RRC material are both directed through a single pump and are sequentially dispensed through a single nozzle. In some embodiments, the RRC material includes at least one solvent capable of dissolving the polymer(s) that comprise the photoresist composition.

The photoresist composition polymer can be any of a variety of materials. In some embodiments, the polymer(s) (i.e., the photoresist composition) has a viscosity of at least 50 centipoise, in some embodiments, the viscosity is in a range from 1500 to 3000 centipoise, while in some embodiments the viscosity will reach or exceed 10,000 centipoise.

Photoresist compositions can be selected from a wide range of formulations including, for example, a polyimide or polybenzoxazole (PBO) film; a polyimide precursor, polyimide, or PBO precursor; or a polyimide matrix resin.

Figure 6:
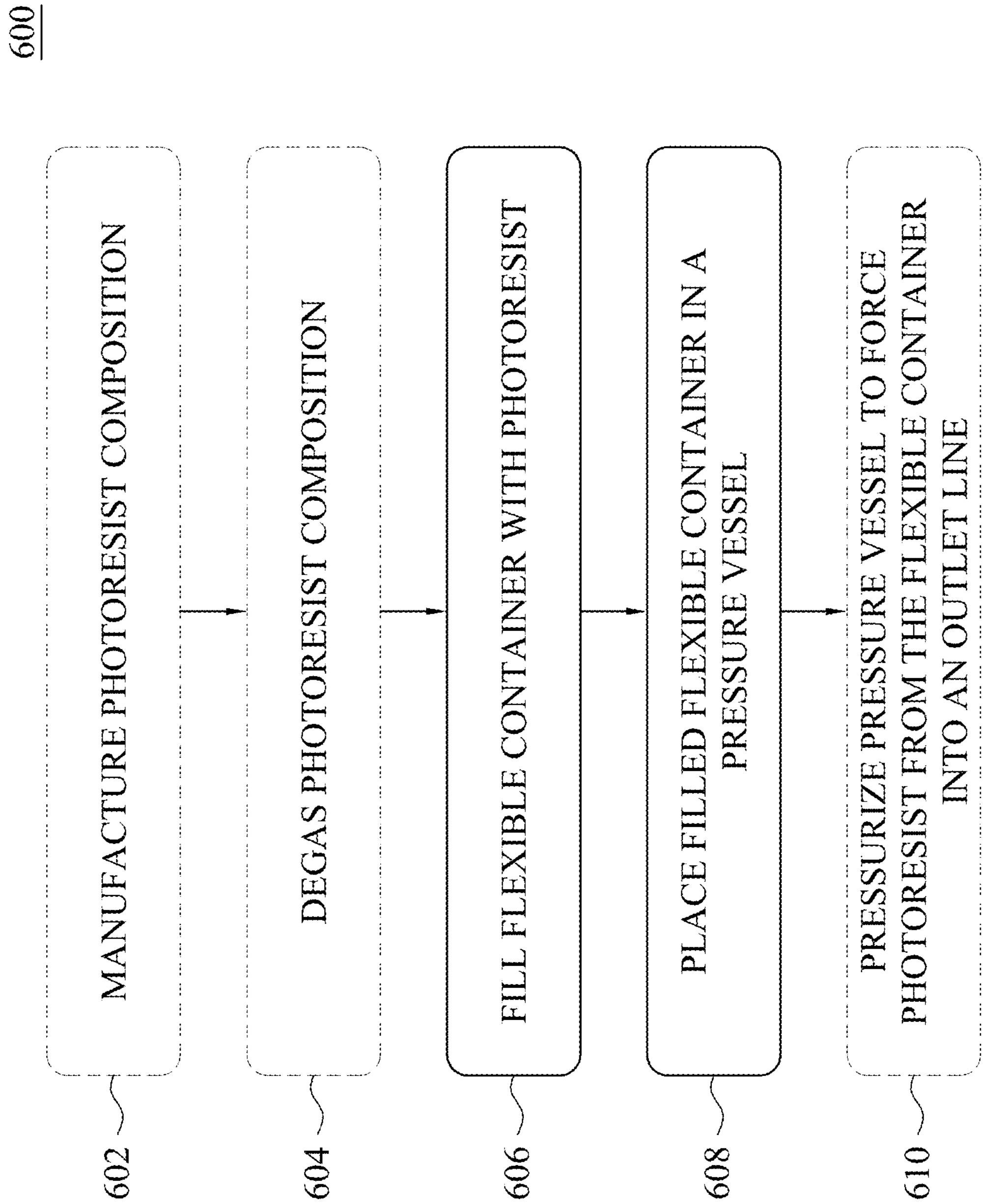
FIG. 6 is a flow chart of a method for preparing a flexible photoresist container in accordance with some embodiments.

FIG. 6 is a flowchart of a method for preparing a flexible photoresist container in accordance with some embodiments. The method is useful for practicing the methods and/or configuring the systems disclosed herein for improving the quality of photoresist films applied to substrates. In some embodiments, in optional operation 602 the photoresist composition will be manufactured. In some embodiments, operation 602 is omitted because the photoresist composition is obtained by purchasing one or more suitable photoresist compositions.

In some embodiments of the method, in optional step 604 the photoresist composition will be degassed through application of reduced pressure and/or increasing a bulk photoresist temperature. The treatment time utilized during the degassing operation(s) depends on a number of factors including, for example, the nature of the dissolved gas(es), the concentration of the dissolved gas(es), the surface area of the photoresist composition being treated, the magnitude of the reduced pressure, and/or the magnitude of the increased photoresist temperature. The degassing operation lowers the concentration of the dissolved gas(es) within the photoresist composition prior to filling the flexible container to help ensure that the subsequent exposure to atmospheric pressure during the photoresist application operation will not generate bubbles within the photoresist composition.

In some embodiments, once the original photoresist composition has been treated to remove a portion of the dissolved gas(es), the treated photoresist composition will be loaded into a flexible photoresist container in step 606. This filling operation should occur shortly after the degassing operation(s) have been completed in order to limit the opportunity for one or more gases to dissolve in the treated photoresist composition. The volume of treated photoresist composition introduced into the flexible photoresist container should be sufficient to provide a target fill volume and expel any residual gas(es) within the flexible photoresist container. For those filling operations that utilize a flexible photoresist container having both an inlet port and an outlet port, in some embodiments, the filling operation may include a deliberate overfill in order to generate a purge flow through the outlet port, thereby ensuring that the treated photoresist composition fills substantially all of the flexible photoresist container.

In some embodiments, once the flexible photoresist container has been filled with the treated photoresist composition, the flexible photoresist container will be placed in and/or attached to a pressure vessel in step 608. In some embodiments, this operation will be completed in conjunction with the manufacture and filling of the flexible photoresist container. A composite or unitary assembly comprising both the flexible photoresist container and the pressure vessel will then be available for installation in the photoresist dispensing apparatus. In some embodiments, the filled flexible photoresist container will be installed in the pressure vessel by an operator or technician as needed.

In some embodiments, once the filled flexible photoresist container and the pressure vessel have been installed in and connected to the coating apparatus, a pressurized space between the interior surface of the pressure vessel and an exterior surface of the flexible photoresist container may be filled with a volume of compressed gas sufficient to apply a target or operating pressure to the exterior surface of the flexible photoresist container, thereby tending to force the photoresist composition from the flexible photoresist container through an outlet port and into the downstream portions of the coating apparatus in optional step 610.

Figure 7:
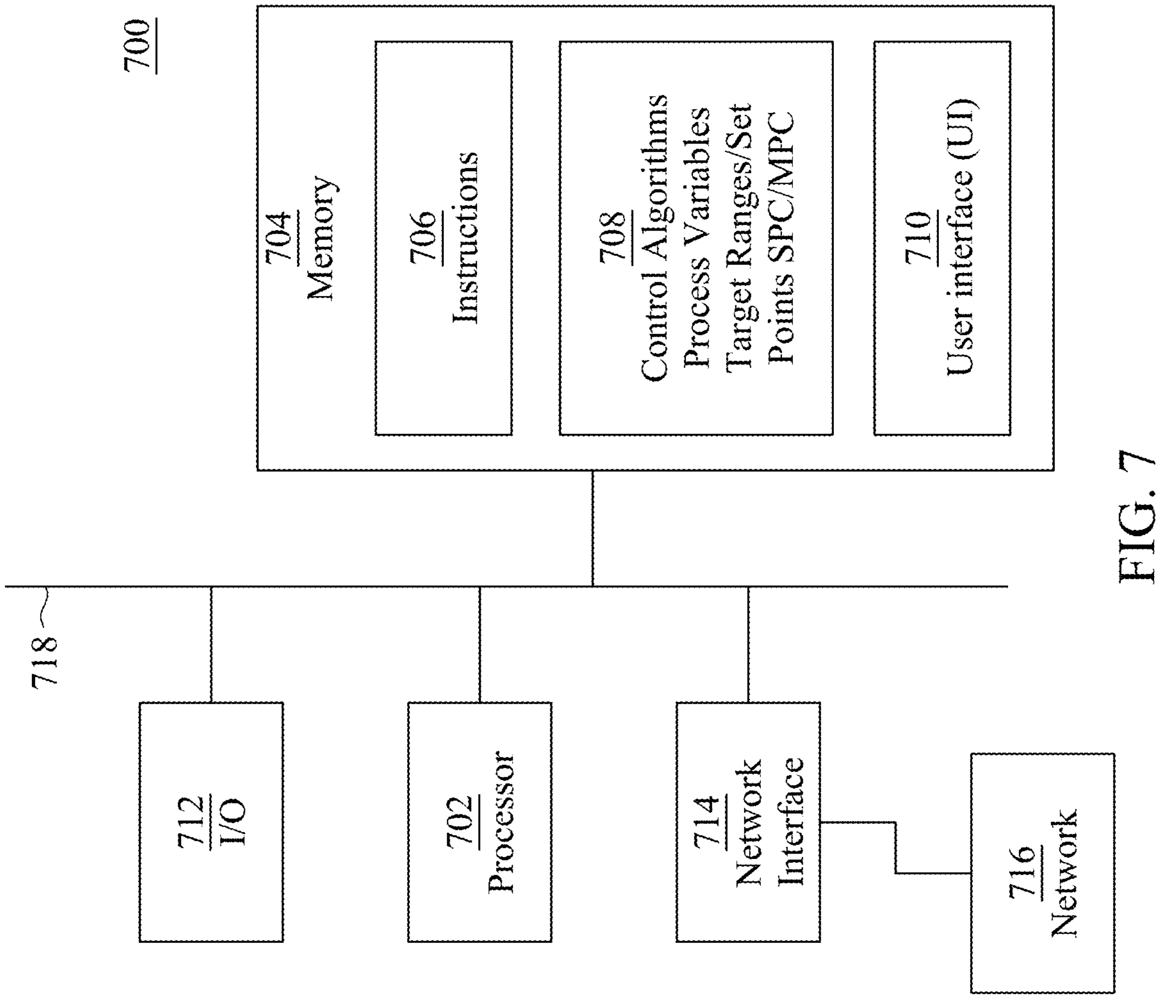
FIG. 7 is a schematic view of an electronic process control (EPC) system useful in the operation of photoresist dispensing systems in accordance with some embodiments.

FIG. 7 is a block diagram of an electronic process control (EPC) system 700, in accordance with some embodiments. Methods described herein of generating cell layout diagrams, in accordance with one or more embodiments, are implementable, for example, using EPC system 700, in accordance with some embodiments. In some embodiments, EPC system 700 is a general purpose computing device including a hardware processor 702 and a non-transitory, computer-readable storage medium 704. Storage medium 704, amongst other things, is encoded with, i.e., stores, computer program code (or instructions) 706, i.e., a set of executable instructions. Execution of computer program code 706 by hardware processor 702 represents (at least in part) an EPC tool which implements a portion or all of, e.g., the methods described herein in accordance with one or more (hereinafter, the noted processes and/or methods).

Hardware processor 702 is electrically coupled to computer-readable storage medium 704 via a bus 718. Hardware processor 702 is also electrically coupled to an I/O interface 712 by bus 718. A network interface 714 is also electrically connected to processor 702 via bus 718. Network interface 714 is connected to a network 716, so that hardware processor 702 and computer-readable storage medium 704 are capable of connecting to external elements via network 716. Hardware processor 702 is configured to execute computer program code 706 encoded in computer-readable storage medium 704 in order to cause system 700 to be usable for performing a portion or all of the noted processes and/or methods. In one or more embodiments, hardware processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause EPC system 700 (where such execution represents (at least in part) the EPC tool) to be usable for performing a portion or all of the noted processes and/or methods. In one or more embodiments, storage medium 704 also stores information which facilitates performing a portion or all of the noted processes and/or methods. In one or more embodiments, storage medium 704 stores process control data 708 including, in some embodiments, control algorithms, process variables and constants, target ranges, set points, and code for enabling statistical process control (SPC) and/or model predictive control (MPC) based control of the various processes.

EPC system 700 includes I/O interface 712. I/O interface 712 is coupled to external circuitry. In one or more embodiments, I/O interface 712 includes a keyboard, keypad, mouse, trackball, trackpad, touchscreen, and/or cursor direction keys for communicating information and commands to processor 702.

EPC system 700 also includes network interface 714 coupled to processor 702. Network interface 714 allows EPC system 700 to communicate with network 716, to which one or more other computer systems are connected. Network interface 714 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 700.

EPC system 700 is configured to receive information through I/O interface 712. The information received through I/O interface 712 includes one or more of instructions, data, design rules, process performance histories, target ranges, set points, and/or other parameters for processing by hardware processor 702. The information is transferred to processor 702 via bus 718. EPC system 700 is configured to receive information related to a user interface (UI) through I/O interface 712. The information is stored in computer-readable medium 704 as user interface (UI) 710.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 700.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

In some embodiments, a coating system comprises a vessel, a flexible container within the vessel, the flexible container including an outlet port, wherein the flexible container is configured to contract in response to an increase in pressure within the vessel, and the flexible container is configured to output a coating composition through the outlet port in response to contraction; and a coating apparatus for receiving the coating composition from the outlet port. In some embodiments, the coating system utilizes a photoresist as the coating composition. In some embodiments, the coating system includes an intermediate reservoir containing a first volume of the coating composition and a second volume of the coating composition is applied to a substrate, a ratio between the first volume and the second volume is at least 5:1. In some embodiments, the coating system utilizes a controller for controlling the pressure within the vessel and/or a filter through which the coating composition passes to reach a dispensing nozzle.

In some embodiments, the coating system utilizes a secondary or an intermediate reservoir between the flexible container and the dispensing nozzle, with the secondary or intermediate reservoir being sized to receive the first volume of the coating composition.

In some embodiments, the coating system utilizes a flexible container having a reinforced region, the reinforced region having an interior surface area and being connected to the first attachment apparatus. In some embodiments, the flexible region has a variable interior surface area and is connected to the reinforced region, wherein the interior surfaces of the reinforced region, the first attachment apparatus, and the flexible region define a variable container volume.

In some embodiments, the coating system utilizes a first attachment apparatus that further comprises a plurality of ports comprising the outlet port and an inlet port. In some embodiments, the outlet port has a first configuration operable for establishing a fluidic connection with the outlet line; and the inlet port has a second configuration operable for preventing the establishment of a fluidic connection to the outlet line.

In some embodiments, a coating method used for forming a coating layer on a substrate involves arranging a flexible container within a pressure vessel, the flexible container containing an initial volume of a coating composition, the initial volume being sufficient to fill the flexible container to a full volume, and an outlet port provided on the flexible container; introducing a pressurized gas into a pressurized volume defined between an exterior surface of the flexible container and an interior surface of the pressure vessel, the pressurized gas tending to force the coating composition through the outlet port and, eventually to a nozzle where the photoresist is applied to a substrate to form a layer of the coating composition.

In some embodiments, the coating method used includes engaging a first attachment assembly on the flexible container with a second attachment assembly on the pressure vessel to form a temporary attachment and define an initial pressurized volume.

In some embodiments, the coating method used includes monitoring a pressure (PV) within the pressurized volume; controlling a flowrate at which additional pressurized gas is introduced into the pressurized volume to maintain an operational pressure between a Target Pressure Low (TPL) and a Target Pressure High (TPH).

In some embodiments, the coating method used includes monitoring a first flowrate of photoresist FR into an intermediate reservoir; controlling a second flowrate at which the pressurized gas is introduced into the pressurized volume to maintain the first flowrate between a lower Target Flowrate Low (TFL) and a higher Target Flowrate High (TFH).

In some embodiments, the coating method used includes isolating the first volume of the coating composition within an intermediate reservoir; reducing the pressure applied to the first volume of the coating composition to a pressure below 1 atm for a treatment period to obtain a degassed coating composition; and releasing the degassed coating composition from the intermediate reservoir for application to the substrate.

In some embodiments, the coating method used includes preparing a unitary assembly comprising the flexible container and the pressure vessel; connecting the pressurized gas to a port provided on the pressure vessel; and connecting the outlet port to an outlet line.

In some embodiments, the coating method used includes isolating the first volume of the coating composition within an intermediate reservoir; monitoring a temperature TV of the first volume of the coating composition; adjusting the temperature TV of the first volume of the coating composition as necessary to obtain a coating composition viscosity within a predetermined viscosity range; releasing the adjusted first volume of the coating composition from the intermediate reservoir for application to the substrate.

In some embodiments, the coating method used includes preparing a flexible container, the flexible container having an initial volume; preparing a coating composition; maintaining the coating composition under a vacuum for a treatment period to reduce by at least 20% a volume of gas ($O_2$, $N_2$, $CO_2$, or mixtures thereof) dissolved in the coating composition to obtain a treated coating composition; introducing a first volume of the treated coating composition to the flexible container, the first volume of the treated composition corresponding to a fill volume of the flexible container, the filled volume defined by an interior surface of the flexible container, with the filled volume being greater than the initial volume.

In some embodiments, the coating method used includes warming the coating composition during the treatment period to a treatment temperature to reduce a gas solubility by at least 20% for at least one gas selected from a group consisting of $N_2$, $O_2$, $CO_2$, and mixtures thereof.

In some embodiments, the coating method used includes evacuating a residual gas from the flexible container; and introducing a second volume of the treated coating composition into the flexible container to generate a purge stream through the outlet port.

Although the subject matter has been described in terms of exemplary embodiments, it is not limited thereto. The appended claims should, therefore, be construed broadly and found to include other variants and embodiments, which may be made by those skilled in the art.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A method of coating a substrate comprising:

arranging a flexible container within a pressure vessel, the flexible container containing a first volume of a coating composition;

engaging a first attachment assembly on the flexible container with a second attachment assembly on the pressure vessel to form a temporary attachment and define an initial pressurized volume;

introducing a pressurized gas into the pressurized volume defined between an exterior surface of the flexible container and an interior surface of the pressure vessel, wherein the pressurized gas forces the coating composition out of the flexible container and through an outlet port; and applying the coating composition to a substrate.

2. The method of coating according to claim 1, further comprising:

monitoring a pressure (PV) within the pressurized volume; and controlling a flowrate at which additional pressurized gas is introduced into the pressurized volume to maintain an operational pressure between a Target Pressure Low (TPL) and a Target Pressure High (TPH).

3. The method of coating according to claim 1, further comprising:

monitoring a first flowrate of photoresist into an intermediate reservoir; and controlling a second flowrate at which the pressurized gas is introduced into the pressurized volume to maintain the first flowrate between a lower Target Flowrate Low (TFL) and a higher Target Flowrate High (TFH).

4. The method of coating according to claim 1, further comprising:

isolating the first volume of the coating composition within an intermediate reservoir;

reducing the pressure applied to the first volume of the coating composition to a pressure below 1 atm for a treatment period to obtain a degassed coating composition; and releasing the degassed coating composition from the intermediate reservoir for application to the substrate.

5. The method of coating according to claim 1, further comprising:

preparing a unitary assembly comprising the flexible container and the pressure vessel; and connecting the pressurized gas to a port provided on the pressure vessel; and connecting the outlet port to an outlet line.

6. The method of coating according to claim 1, further comprising:

isolating the first volume of the coating composition within an intermediate reservoir;

monitoring a temperature Tv of the first volume of the coating composition;

adjusting the temperature Tv of the first volume of the coating composition to obtain a coating composition viscosity within a predetermined viscosity range; and releasing the adjusted first volume of the coating composition from the intermediate reservoir for application to the substrate, wherein the coating composition is photoresist.

7. A method of coating a substrate comprising:
inserting a flexible vessel into a pressure vessel;
securing a reinforced region of the flexible vessel to the pressure vessel using a first attachment apparatus;
introducing a first volume of a coating composition into the flexible vessel through an inlet port, wherein the flexible vessel is contained within the pressure vessel;
introducing a working fluid into the pressure vessel through a pressurizing port to increase a pressure applied to an exterior surface of the flexible vessel, thereby forcing a second volume of the coating composition out of the flexible vessel through an outlet port; and
applying a third volume of the coating composition to a surface of the substrate through a dispensing nozzle.

8. The method according to claim 7, further comprising:
removing a portion of the working fluid from the pressure vessel to allow for expansion of the flexible vessel;
introducing a makeup volume of the coating composition to reestablish the first volume of the coating composition within the flexible vessel.

9. The method according to claim 7, further comprising:
receiving the second volume of the coating composition in an intermediate reservoir; and
treating the second volume of the coating composition within the intermediate reservoir before a third volume of the coating composition is applied to the surface of the substrate.

10. The method according to claim 9, further comprising:
treating the coating composition within the intermediate reservoir to provide a viscosity value within a predetermined target viscosity range.

11. The method according to claim 9, further comprising:
treating the coating composition within the intermediate reservoir to reduce a volume of dissolved gas within the coating composition.

12. The method according to claim 9, further comprising:
filtering the third volume of the coating composition between the intermediate reservoir and the dispensing nozzle.

13. The method according to claim 7, further comprising:
treating the surface of the substrate to provide a conditioned surface; and
applying the third volume of the coating composition to the conditioned surface.

14. The method according to claim 7, further comprising:
treating the coating composition to provide a viscosity value within a predetermined target viscosity range before introducing the first volume of the coating composition into the flexible vessel.

15. The method according to claim 7, further comprising:
treating the coating composition to provide a dissolved gas value within a predetermined target dissolved gas range before introducing the first volume of the coating composition into the flexible vessel.

16. A method of preparing a coating composition comprising:
maintaining a coating composition under a vacuum for a treatment period sufficient to reduce by at least 20% an initial volume of gas dissolved in the coating composition to obtain a treated coating composition;
warming the coating composition during the treatment period to a treatment temperature to reduce a gas solubility by at least 20% for a gas selected from the group consisting of $N_2$, $O_2$, $CO_2$, and mixtures thereof; and
introducing a first volume of the treated coating composition into a flexible container.

17. The method of preparing a coating composition according to claim 16, further comprising:
evacuating a residual gas from the flexible container; and
introducing a volume of the treated coating composition into the flexible container.

18. The method of preparing a coating composition according to claim 16, wherein maintaining the coating composition under the vacuum for the treatment period comprises maintaining the coating composition under the vacuum for the treatment period to provide a viscosity value of the coating composition within a predetermined target viscosity range.

19. The method of preparing a coating composition according to claim 16, wherein maintaining the coating composition under the vacuum for the treatment period comprises reducing a pressure applied to the coating composition to a pressure below 1 atm for the treatment period.

20. The method of preparing a coating composition according to claim 16, wherein maintaining the coating composition under the vacuum for the treatment period comprises maintaining the coating composition under the vacuum within an intermediate reservoir for the treatment period.

* * * * *